United States Patent
Ueda et al.

[11] Patent Number: 5,883,411
[45] Date of Patent: Mar. 16, 1999

[54] VERTICAL INSULATED GATE FET

[75] Inventors: Daisuke Ueda, Nagaokakyo City; Hiromitsu Takagi, Shiga, both of Japan

[73] Assignee: Matsushita Electronics Corporation, Osaka, Japan

[21] Appl. No.: 982,068

[22] Filed: Nov. 23, 1992

Related U.S. Application Data

[63] Continuation of Ser. No. 624,519, Dec. 7, 1990, abandoned, which is a continuation of Ser. No. 518,328, May 4, 1990, abandoned, which is a continuation of Ser. No. 376,374, Jul. 5, 1989, abandoned, which is a division of Ser. No. 122,603, Nov. 18, 1987, abandoned, which is a continuation of Ser. No. 509,055, Jun. 29, 1983, abandoned.

[30]  Foreign Application Priority Data

Jul. 5, 1982 [JP] Japan ................................. 57-117303

[51] Int. Cl.⁶ .......................... H01L 29/76; H01L 29/94; H01L 31/062; H01L 31/113
[52] U.S. Cl. ......................... 257/331; 257/332; 257/622; 257/628
[58] Field of Search ............................. 357/23.4, 60, 55; 257/331, 332, 622, 628

[56]  References Cited

U.S. PATENT DOCUMENTS

| | | | |
|---|---|---|---|
| 3,785,886 | 1/1974 | Castrucci et al. | 357/60 |
| 4,070,690 | 1/1978 | Wickstrom | 357/55 |
| 4,084,175 | 4/1978 | Ouyang | 437/38 |
| 4,131,496 | 12/1978 | Weitzel et al. | 357/60 |
| 4,243,997 | 1/1981 | Natori et al. | 357/23 |
| 4,278,987 | 7/1981 | Imaizumi et al. | 357/55 |
| 4,374,455 | 2/1983 | Goodman | 437/38 |
| 4,577,208 | 3/1986 | Schutten et al. | 357/23.4 |

OTHER PUBLICATIONS

Sze, S., *Physics of Semiconductor Devices*, John Wiley & Son, 1969, pp. 16–17.
Ammar, et al., "UMOS Transistors on (110) Silicon", *IEEE Trans. Elec. Dev.* vol. ED.27, No. 5 May 1980, pp. 907–914.
Basson, E., "Fabrication of Novel . . . ", *IEEE Trans Elec. Dev.*, vol. ED–25, No. 10, Oct. 1978, pp. 1178–1183.
Bean, K., "Anistropic etching of Silicon", *IEEE Trans. Elec. Dev.*, vol. ED–25, No. 10, Oct. 1978, pp. 1185–1193.
Theoretical Comparisons of DMOS and VMOS Structures for Voltage and On–Resistance, V.A.K. Temple and P.V. Gray, General Electric Corporate Research and Development Center, Schenectady, NY. Technical Digest of International Electron Devices Meeting, 1979, Washington, DC, Dec. 3–4–5, pp. 88–92.
Design Construction, and Performance of High Power RF VMOS Devices, R. J. Johnsen and H. Granberg, Motorola Semiconductor Products, Inc., Phoenix, AZ.
Technical Digest of International Electron Devices Meeting, 1979, Washington, Dec. 3–4–5, pp. 93–96, Sponsored by Electron Devices Society of IEEE.
A New VMOS Power FET, S. Kay, C. T. Trieu and B. H. Yeh, Siliconix, Inc., Santa Clara, CA. Technical Digest of International Electron Devices Meeting, 1979, Washington, D.C., Dec. 3–4–5, pp. 98–101, Sponsored by Electron Devices Society of IEEE.
David N.K. Wang et al., "Reactive Sputter Etching and its Application", Solid State Technology/Aug., 1980, pp. 122–126.
David N.K. Wang et al., "Dry Etching Technology for Fine Line Devices", Solid State Technology/May, 1981, pp. 122–125.

(List continued on next page.)

*Primary Examiner*—Ngân V. Ngô
*Attorney, Agent, or Firm*—Pillsbury Madison & Sutro LLP

[57] ABSTRACT

An insulated gate FET such as a power MOS FET is made by forming a rectangular parallelepiped-shaped recess in a direction that the side walls of the recess make 45° angle against the <100> direction of the silicon substrate having (100) plane as principal surface, and the vertical side walls of (010) or (001) planes are used as channel region of the insulated gate FET, thereby assuring a large electron mobility in the channel, hence low channel resistance suitable for high power operation.

5 Claims, 3 Drawing Sheets

OTHER PUBLICATIONS

Keizo Suzuki et al., "Microwave Plasma Etching", Japanese Journal of Applied Physics vol. 16, No. 11, Nov., 1977, pp. 2979–1984.

Power Mosfet Technology (Invited Paper), A. Lidow, T. Herman and H.W. Collins, International Rectifier, El Segundo, CA. Technical Digest of International Electron Devices Meeting, 1979, Washington, D.C., Dec. 3–4–5, pp. 79–83 sponsored by Electron Devices Society of IEEE.

VERTICAL INSULATED GATE FET

This application is a continuation of application Ser. No. 07/624,519, filed Dec. 7, 1990, now abandoned, which is a continuation of application Ser. No. 07/518,328, filed May 4, 1990, now abandoned, which is a continuation of application Ser. No. 07/376,374, filed Jul. 5, 1989, now abandoned, which is a division of application Ser. No. 07/122,603, filed Nov. 18, 1987, now abandoned, which is a continuation of application Ser. No. 06/509,055, filed Jun. 29, 1983, now abandoned.

BACKGROUND OF THE INVENTION

The present invention relates to an improvement in an insulation gate FET, especially for a power insulated gate FET.

An insulated gate FET has a technical advantage of high speed operation in comparison with a general bipolar transistor since it is a majority carrier device. Especially in recent years, the advantage of the insulated gate FET is being recognized, and the insulated gate FET is being improved into a large power type.

FIG. 1 shows a sectional elevation view of the conventional insulated gate FET for high power use. The conventional insulated gate FET device has, as shown in FIG. 1, a high concentration n-type substrate having a (100) plane as its principal face, an epitaxially grown low concentration n-type layer 2 formed on the substrate 1, a p-type diffused layer further grown on the n-type epitaxial layer 2, the diffused p-type layer 3 to become a channel region, high concentration n$^+$-type diffused regions 4 to become source regions formed from the surface of the p-type diffused layer, source electrodes 5, gate insulation films 6 and gate electrodes 7.

The gate electrodes are made in a V-shape by utilizing a difference in the etching speed of the (100) plane and the (111) plane, namely anisotropic etching method, carried out from the surface of the substrate wafer. Accordingly the channel regions 3 are formed on (111) plane, accordingly the electron mobility is small, and thereby the channel resistance is large and hence the ON-resistance is large. In order to reduce this ON-resistance, to reduce the thickness of the channel region 3 or to grow the concentration of the channel region 3 can he considered, but such measure results n lowering of breakdown voltage, and therefore the measure has a limit.

SUMMARY OF THE INVENTION

The purpose of the present invention is to provide a vertical type insulated gate FET wherein a channel region is formed on a plane equivalent to (100) plane, which has small surface level density and large electron mobility, thereby providing the small channel resistance and hence a small ON-resistance.

That is, an insulated gate FET in accordance with the present invention comprises:

a silicon substrate having a principal plane of (100) plane, at least rectangular shaped recess formed in the principal plane and having side walls perpendicular to the plane of the principal plane, the recess being in such a direction that the side walls make angles of 45° against (01$\bar{1}$) plane of the substrate, thereby making the side walls a (010) and (001) plane, and a gate electrode formed on at least one of the side wall to make the side wall a channel.

DESCRIPTION OF THE PREFERRED EMBODIMENTS

Figure 3A:
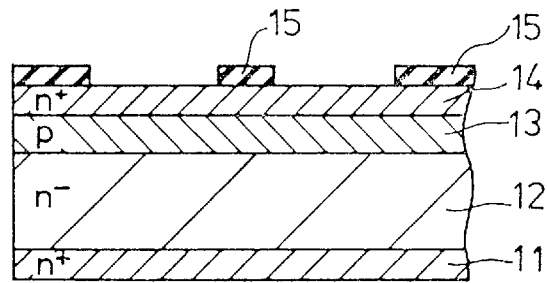
FIG. 3(a), FIG. 3(b), FIG. 3(c) and FIG. 3(d) are sectional elevation views illustrating steps of manufacturing an insulated gate FET embodying the present invention.
Figure 3B:
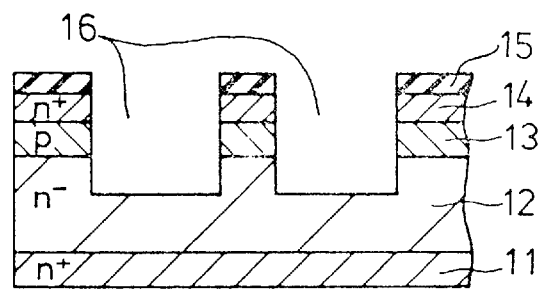
Figure 3C:
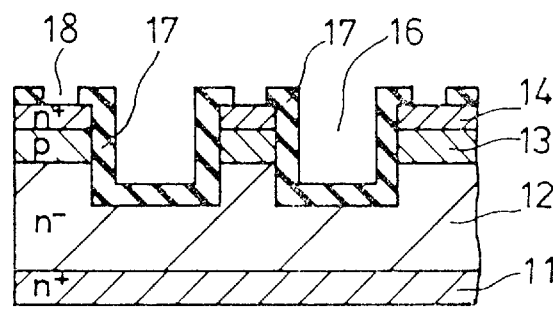
Figure 3D:
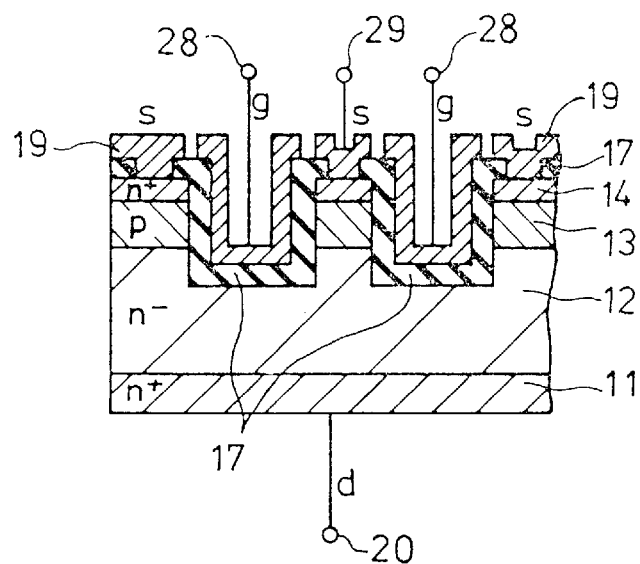

Details of the configuration and manufacturing steps of the insulated gate FET in accordance with the present invention is elucidated with reference to FIG. 3(a) and thereafter.

Figure 1:
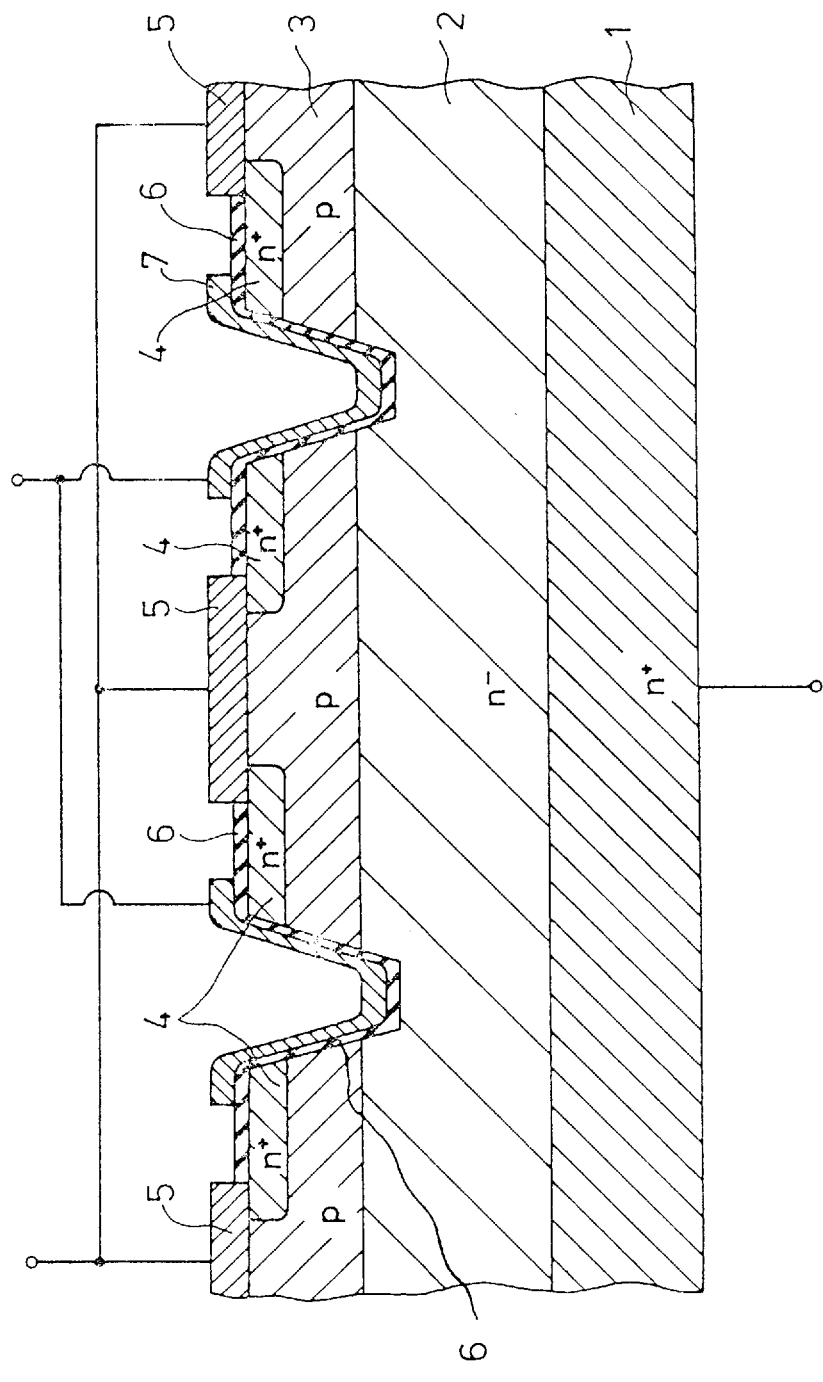
FIG. 1 is the sectional elevation view of the conventional vertical type power insulated gate FET.
Figure 2A:
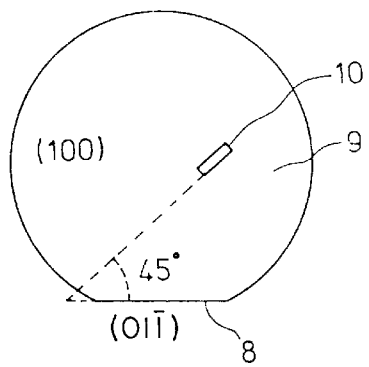
FIG. 2(a) is a plan view illustrating principle of the selection of a particular plane of the present invention.
Figure 2B:
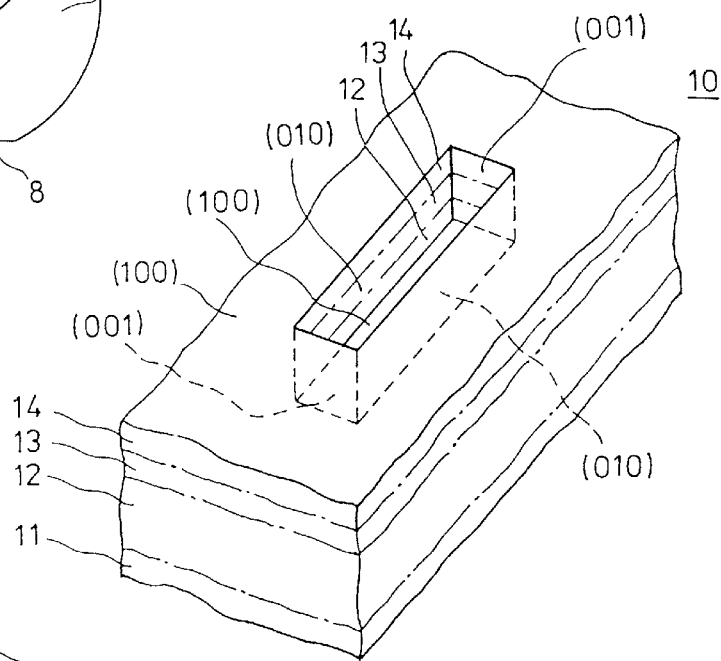
FIG. 2(b) is an enlarged perspective view of a rectangle prism recess part to be formed on the semiconductor substrate of FIG. 2(a).

Firstly principle of the present invention is elucidated with reference to FIG. 2(a) and FIG. 2(b), wherein on a semiconductor substrate having (100) plane as principal face and having facet 8 in (01$\bar{1}$) plane is used as a starting wafer. On the substrate as shown in FIG. 2(a), a rectangle parallelipiped shaped recess 10 is formed in a direction that its side walls are making an angle of 45° against (01$\bar{1}$) plane by means of etching. As shown in FIG. 2b, the recess 10 is box-like with rectangular sides. In this forming of the recess it is important that the etching of the silicon semiconductor wafer should be made in a manner that the side walls of the recess 10 is etched vertically from the (100) plane as shown in FIG. 2(b), which is an enlarged view of the recess 10. Then the side face of the rectangle shaped recess are (010) and (001) planes, and these vertical planes are equivalent to the (100) plane with respect to electron mobilities. In order to vertically etching from the silicon substrate face, ordinary active ion etching method or reactive ion beam etching method can be used.

Nextly, making of insulated gate FET is elucidated in detail taking a manufacturing of a MOS FET as an example, with reference to FIG. 3(a) to FIG. 3(d). Firstly, a silicon substrate 11 of high concentration n-type conductivity having (100) plane having an epitaxially grown lower concentration n-type layer 12 is used as starting wafer. In the example, the n-type epitaxial layer 12 has a specific resistance ρ of 1 Ωcm and thickness of 9 μm. Then on this epitaxial layer, p-type layer 13 having impurity concentration of $5\times10^{17}\Omega cm^{-3}$ and having a depth of 2 μm, and thereon a high concentration n-type top layer 14 having impurity concentration of $1\times10^{21}\Omega cm^{-3}$ and depth of 0.5 μm are sequencially formed by known ordinary ion implantation method and thermal diffusion method. These p-type layer 13 and n-type layer 14 are layers to become channel region and source regions, respectively. Then thereon a field oxide film 15 of about 1 μm thickness is formed on all the substrate, and further thereon a known photolithographic process is carried out to form openings 16, 16 by partly removing the oxide film at the gate regions as shown in FIG. 3 (a).

Then as has been elucidated with reference to FIG. 2 a rectangle shaped recess 10 is formed from the substrate surface in such a direction that its side wall makes an angle of 45° against the facet 8 of the wafer and in a manner that the side walls are vertical to the (100) plane of the principal face of the wafer and in a manner to penetrate to the p-type layer 13 and to reach the epitaxial layer 12 as shown in FIG. 3(*b*). As a result of the etching, the bottom face of the etched recess is (100) plane and the vertical side walls are (010) and (001) planes.

Then, as shown in FIG. 3(*c*), a gate oxide film 17 is formed to a thickness of about 1000 Å by a known method, and openings 17, 17 for making electric conduction onto the n$^+$-type layer 14 are formed through the oxide film 17 thereby forming the openings 18, 18.

Lastly, electrodes 19, 19, 19 such as of aluminum are vacuum deposited to form gate and source electrodes, as shown in FIG. 3(*d*). A drain electrode 20 is formed by vacuum depositing a metal electrode on the bottom face of the high concentration n-type substrate 11 by known method.

Figure 4:
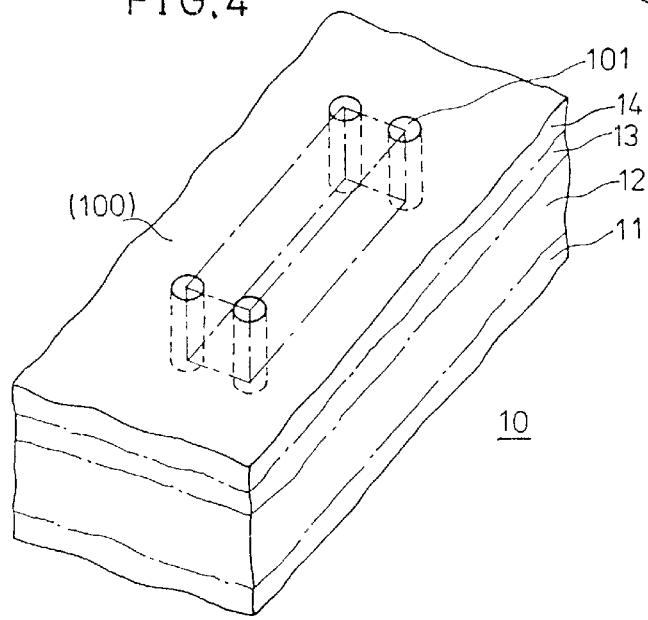
FIG. 4 is an enlarged perspective view of the substrate where rectangle shaped recess is to be made in another embodiment.

FIG. 4 shows another embodiment, wherein high concentration diffused regions are formed at corner parts of the rectangle prism-shaped recess 10 preliminarily to the etching of the recess 10, by means of known selective diffusion method. Alternatively, the forming of the high concentration diffused regions at the corner parts of the rectangle shaped recess may be made after making of the recess 10 by suitable selective diffusion. By such forming of the high concentration diffused regions at the corner parts of the rectangle shaped recess, possible high resistance, hence, possible small mobility due to partial irregularity of the (010) plane and (001) plane at the corner parts can be compensated, thereby a high electron mobility is assured on all the side walls of the rectangle shaped recess 10, and accordingly, a higher performance is attainable.

As has been elucidated, the insulated gate FET in accordance with the present invention has channel region in the (010) plane and (001) plane which are physically equivalent to the (100) plane. Therefore the channel region has a large electron mobility, and the channel resistance at ON state can be made very small, and therefore the FET has satisfactory high power performance.

What is claimed is:

1. A power vertical insulated gate FET comprising:

silicon substrate (11) having a principal plane of (100) plane, an epitaxially grown lower concentration n-type layer (12) on said substrate, at least one rectangular parallelepiped recess (16) formed in said principal plane, extending to said epitaxially grown layer and having side walls perpendicular to said principal plane, said side walls defining four corner parts thereof;

said recess being formed in such a direction that at least two of said side walls thereof make angles of 45° against the (01$\bar{1}$) plane of said substrate, said at least two side walls being formed along (010) planes and the other of said side walls being formed along (001) planes, an oxide film (17) formed on at least one of said side walls, a gate electrode (28) formed over said oxide film on said at least one side wall to make said one side wall a channel, and a high concentration region (101) formed in at least one of the four corner parts of said rectangular recess.

2. A power insulated gate FET in accordance with claim 1, wherein said rectangular parallelepiped recess is a reactive ion etched recess having substantially perpendicular side walls and a flat bottom face parallel to the principal plane of the substrate.

3. A power vertical insulated gate FET in accordance with claim 1, further comprising:

a high concentration region formed in the neighborhood of at least one vertical edge of said rectangular parallelepiped recess.

4. A power vertical insulated gate FET comprising:

a silicon substrate of high concentration n-type conductivity having a principal (100) plane, an epitaxially grown lower concentration n-type epitaxial layer on said substrate, a p-type layer formed on said epitaxially grown n-type layer, a high concentration n-type top layer formed on said p-type layer, a rectangular parallelepiped-shaped recess formed in such a direction that its side walls make an angle of 45° against the (01$\bar{1}$) plane of said substrate and in a manner that said side walls are vertical to the (100) plane of said substrate and further in a manner to penetrate to the p-type layer and to reach the epitaxial layer from said top layer, an oxide film formed in said recess and on said top layer, an electrode opening formed at a part of said oxide film on said top layer, a gate electrode formed on a part of said oxide film formed in said recess, a source electrode of aluminum formed at said electrode opening, and a drain electrode formed on said substrate.

5. A power vertical channel insulated-gate FET, comprising:

a silicon substrate having a principal surface of (100) plane;

an epitaxially grown lower concentration n-type epitaxial layer on said principal surface;

a p-type layer formed on said epitaxially grown n-type layer;

a high concentration n-type top layer formed on said p-type layer;

at least one rectangular parallelepiped-shaped recess formed in said top layer and said p-type layer and extending at least to said epitaxial layer, the recess defined by first spaced apart side walls and second spaced apart side walls substantially perpendicular to said first side walls, said first and second side walls substantially perpendicular to said principal surface of said substrate, said first side walls longer in length than said second side walls and formed at an angle of 45° relative to the (01$\bar{1}$) plane of said substrate to provide, respectively, said first and second side walls formed in the (010) and the (001) planes;

an oxide film formed in said recess and on said top layer;

an electrode layer formed on at least one of said side walls to define a vertical channel insulated gate;

a source electrode of aluminum formed on the top layer through the electrode opening; and a drain electrode formed on said substrate.

* * * * *